United States Patent
Kawano et al.

(10) Patent No.: US 9,614,482 B2
(45) Date of Patent: Apr. 4, 2017

(54) AMPLIFIER

(71) Applicants: FUJITSU LIMITED, Kawasaki-shi, Kanagawa (JP); FUJITSU SEMICONDUCTOR LIMITED, Yokohama-shi, Kanagawa (JP)

(72) Inventors: Yoichi Kawano, Setagaya (JP); Shinji Yamaura, Akiruno (JP)

(73) Assignees: FUJITSU LIMITED, Kawasaki (JP); FUJITSU SEMICONDUCTOR LIMITED, Yokohama (JP)

( * ) Notice: Subject to any disclaimer, the term of this patent is extended or adjusted under 35 U.S.C. 154(b) by 100 days.

(21) Appl. No.: 14/481,042

(22) Filed: Sep. 9, 2014

(65) Prior Publication Data
US 2015/0097619 A1    Apr. 9, 2015

(30) Foreign Application Priority Data
Oct. 3, 2013  (JP) .................................. 2013-208504

(51) Int. Cl.
*H03F 1/26* (2006.01)
*H03F 1/32* (2006.01)
(Continued)

(52) U.S. Cl.
CPC ............. *H03F 1/32* (2013.01); *H03F 1/0266* (2013.01); *H03F 1/3205* (2013.01);
(Continued)

(58) Field of Classification Search
CPC ............... H03F 1/32; H03F 2201/3215; H03F 2200/387; H03F 1/0266; H03F 1/3205;
(Continued)

(56) References Cited

U.S. PATENT DOCUMENTS 2,951,208 A * 8/1960 Barton ...................... H03F 1/30
330/273
3,579,051 A * 5/1971 Olsen ..................... H01H 47/34
330/8

(Continued)

FOREIGN PATENT DOCUMENTS

JP      H11-289227     10/1999
WO      01/41300 A1    6/2001

OTHER PUBLICATIONS

Extended European Search Report dated Mar. 9, 2015 issued with respect to the corresponding European Patent Application No. 14184102.3.

(Continued)

*Primary Examiner* — Khanh V Nguyen
(74) *Attorney, Agent, or Firm* — Kratz, Quintos & Hanson, LLP

(57) ABSTRACT

An amplifier includes two input terminals to receive a differential, two-tone transmission signal; two output terminals; a coil having terminals connected with the input terminals respectively, and a center tap; a first transistor having the gate connected with one terminal of the coil, and the output terminal connected with one output terminal; a second transistor having the gate connected with the other terminal of the coil, and the output terminal connected with the other output terminal; a diode having a terminal connected with the center tap; and a bias circuit connected with the other terminal of the diode to output a gate voltage to turn on the first and second transistors. The diode adjusts the terminal voltage depending on a signal level of a double harmonic wave of the transmission signal supplied to the terminal of the diode from the center tap.

5 Claims, 13 Drawing Sheets

(51) Int. Cl.
*H03F 1/02* (2006.01)
*H03F 1/56* (2006.01)
*H03F 3/24* (2006.01)
*H03F 3/45* (2006.01)

(52) U.S. Cl.
CPC ......... *H03F 1/3211* (2013.01); *H03F 1/3276* (2013.01); *H03F 1/565* (2013.01); *H03F 3/245* (2013.01); *H03F 3/45179* (2013.01); H03F 1/26 (2013.01); H03F 2200/165 (2013.01); H03F 2200/216 (2013.01); H03F 2200/246 (2013.01); H03F 2200/387 (2013.01); H03F 2201/3215 (2013.01); H03F 2203/45541 (2013.01); H03F 2203/45552 (2013.01); H03F 2203/45554 (2013.01); H03F 2203/45568 (2013.01); H03F 2203/45576 (2013.01)

(58) Field of Classification Search
CPC ...... H03F 1/3211; H03F 1/3276; H03F 1/565; H03F 3/245; H03F 3/45179; H03F 2203/45576; H03F 2200/16
USPC ... 330/124 R, 149, 188, 190, 277, 285, 296, 330/302
See application file for complete search history.

(56) References Cited

U.S. PATENT DOCUMENTS

| | | | | |
|---|---|---|---|---|
| 3,898,575 | A | | 8/1975 | Koch |
| 5,087,893 | A | * | 2/1992 | Petersen .............. H03G 3/3042 330/136 |
| 5,532,639 | A | * | 7/1996 | Rotay .................... H03F 3/191 327/314 |
| 5,532,647 | A | * | 7/1996 | Kawakami ........... H03G 1/0052 330/284 |
| 6,791,411 | B1 | | 9/2004 | Simburger et al. |
| 7,893,771 | B2 | * | 2/2011 | Lau .......................... H03F 1/32 330/285 |
| 8,373,503 | B1 | * | 2/2013 | Myers .................. H03F 1/3223 330/149 |

OTHER PUBLICATIONS

Office Action mailed on Dec. 29, 2016 issued with respect to the corresponding Chinese Patent Application No. 201410498423.0; full translation of office action.

* cited by examiner

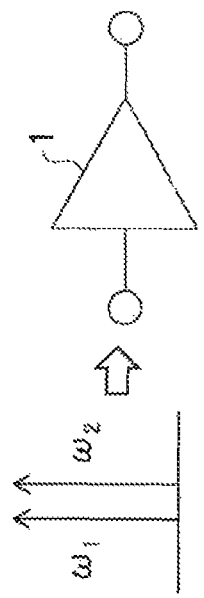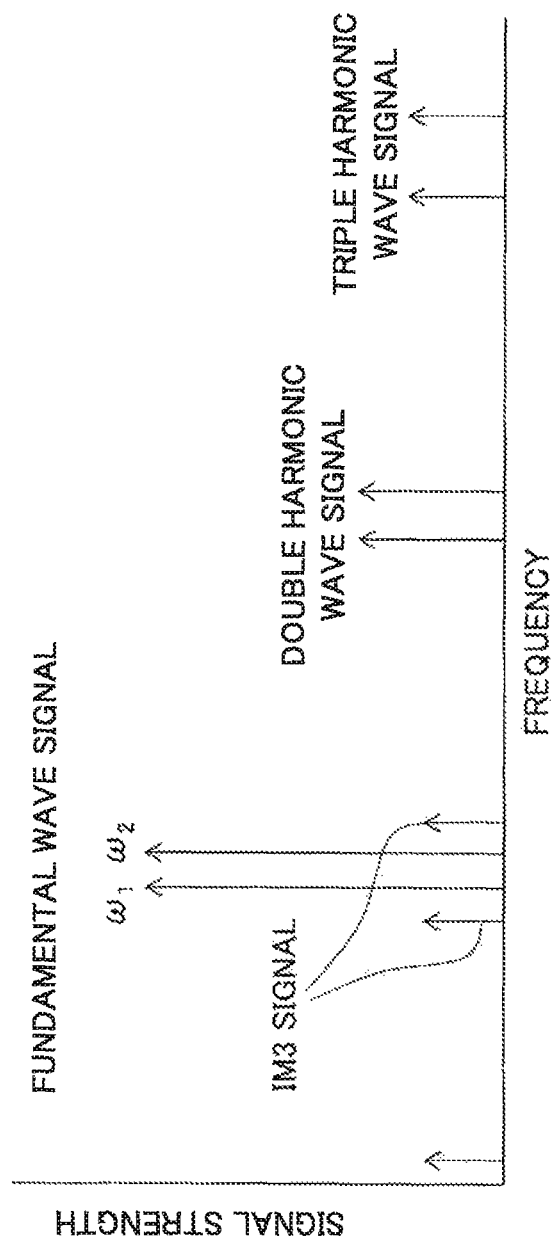

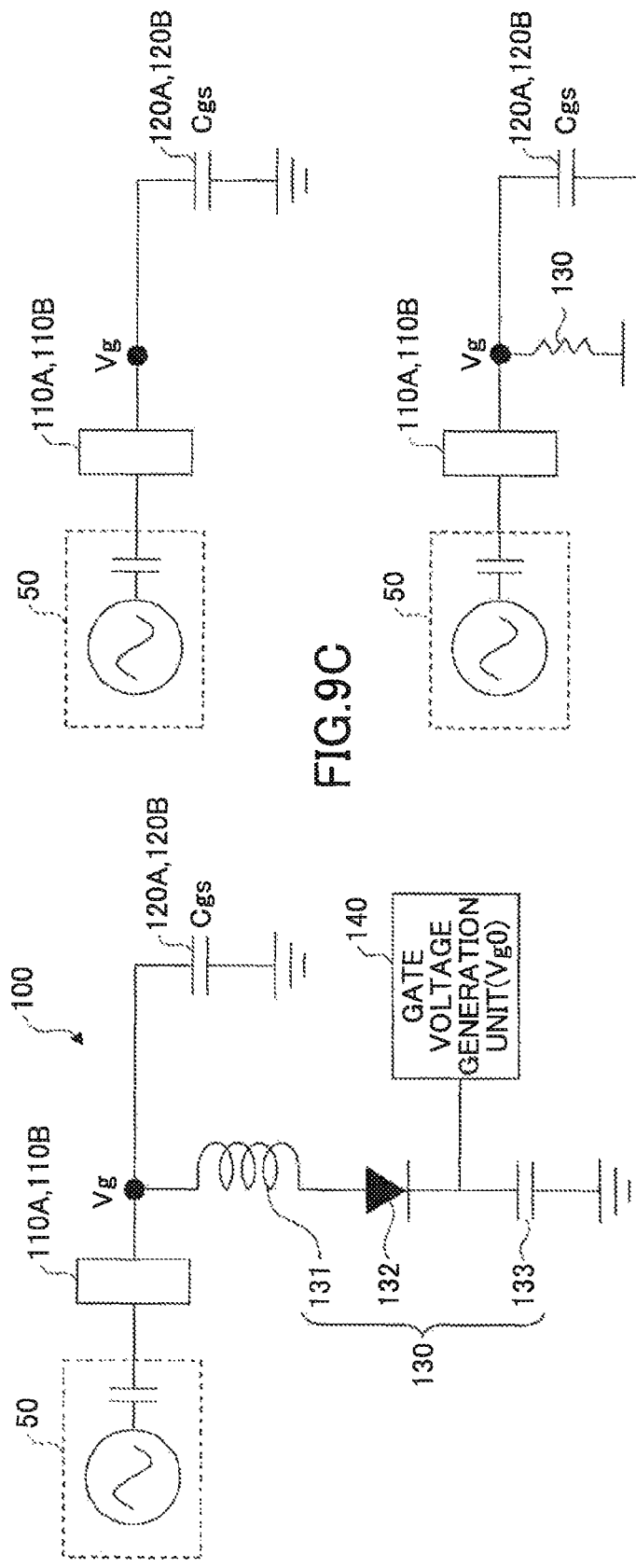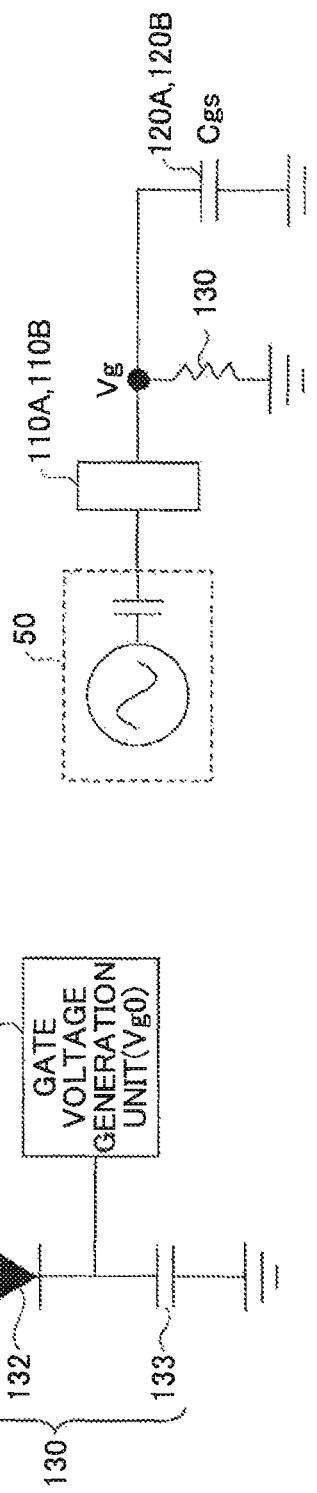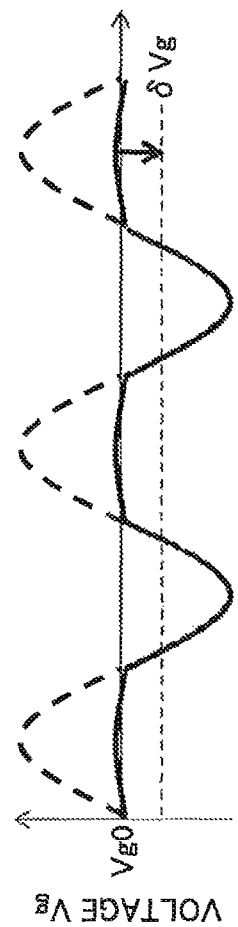

AMPLIFIER

CROSS-REFERENCE TO RELATED APPLICATIONS

This application is based upon and claims the benefit of priority of the prior Japanese Priority Application No. 2013-208504 filed on Oct. 3, 2013, the entire contents of which are hereby incorporated by reference.

FIELD

The disclosures herein generally relate to an amplifier.

BACKGROUND

Conventionally, a distortion compensation circuit has been known that includes a distortion control unit capable of independently controlling non-linear distortion components of orders from the second order up to the 2N-th order (N≥2) where a non-linear distortion component configures an even-numbered, power of at least one of the fundamental frequency components and the double harmonic wave frequency component of an input wireless signal; and an amplitude modulation unit to perform amplitude modulation using the wireless signal and the output signal of the distortion control unit (see, for example. Patent Document 1).

RELATED-ART DOCUMENTS

Patent Documents

[Patent Document 1] Japanese Laid-open Patent Publication No. H11-289227

Incidentally, a conventional distortion compensation circuit has a problem that the circuit, configuration is complex because it includes a distortion control unit and a distortion compensation circuit as described, above to reduce distortion.

SUMMARY

According to at least one embodiment of the present invention, an amplifier includes a pair of input terminals configured to receive as input a transmission signal being differential and two-tone; a pair of output terminals; a coil configured to have both terminals connected with the pair of input terminals, respectively, and to have a center tap; a first transistor configured to have a gate connected with one of the terminals of the coil, and an output terminal of the first transistor connected with one of the pair of output terminals; a second transistor configured to have a gate connected with another of the terminals of the coil, and an output terminal of the second transistor connected with another of the pair of output terminals; a diode configured to have a terminal connected with the center tap of the coil; and a bias circuit configured to be connected with another terminal of the diode, and to output a predetermined gate voltage to turn on the first transistor and the second transistor. The diode adjusts a voltage at the terminal of the diode depending on a signal level of a double harmonic wave of the transmission signal supplied to the terminal of the diode from the center tap of the coil.

The object and advantages of the embodiment will be realized and attained by means of the elements and combinations particularly pointed out in the claims. It is to be understood that both the foregoing general description and the following detailed description are exemplary and explanatory and are not restrictive of the invention as claimed.

BRIEF DESCRIPTION OF DRAWINGS

FIGS. 6A-6B are diagrams illustrating a method of detecting the strength of the IM3 signal in the amplifier 100 according to the first embodiment;

FIGS. 9A-9D are diagrams illustrating a state where an adjustment voltage δVg is generated by a diode 132;

DESCRIPTION OF EMBODIMENTS

Before describing amplifiers according to embodiments of the present invention, an amplifier will be described according to a conventional technology using FIGS. 1-2.

Figure 1:
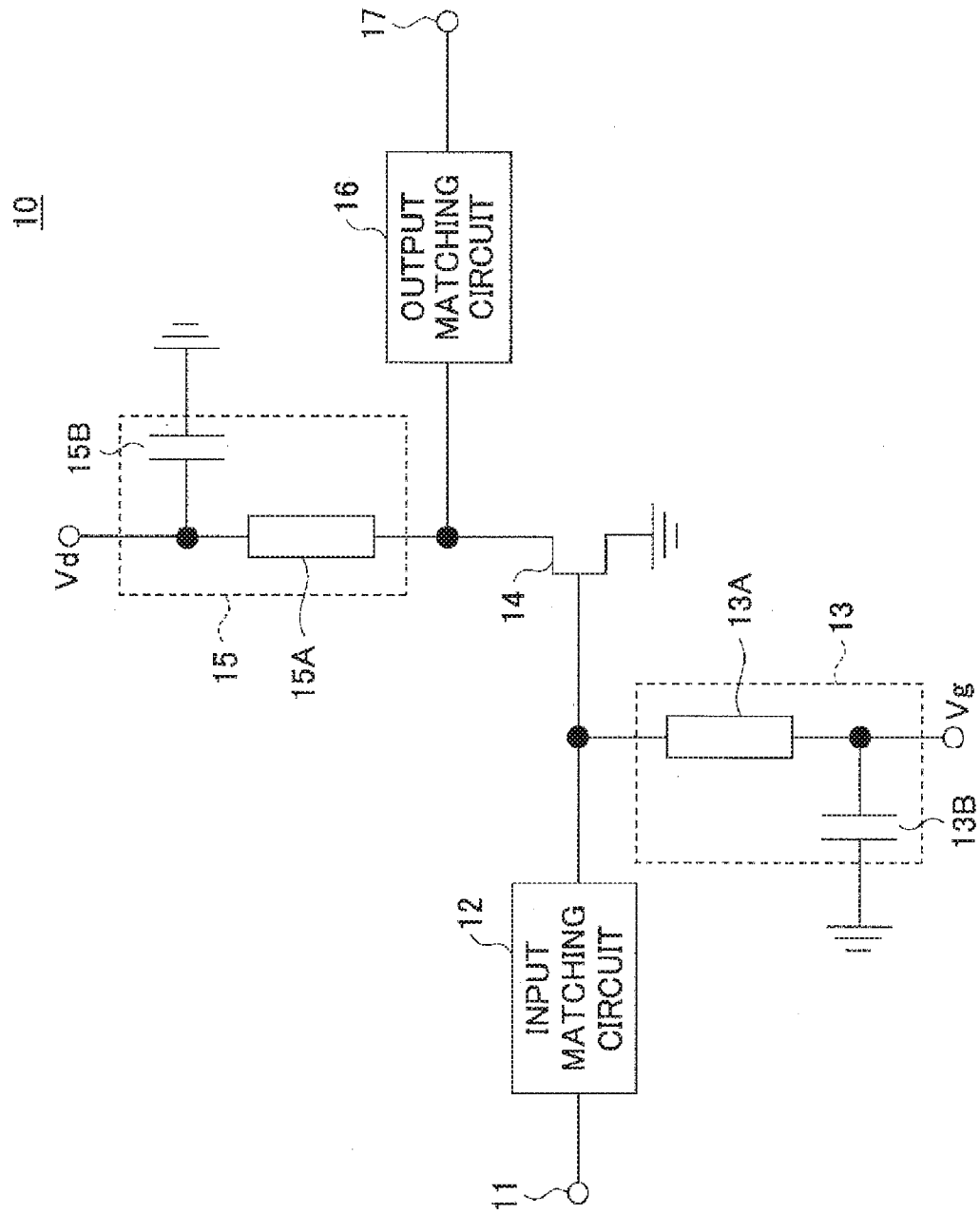
FIG. 1 is a diagram illustrating an amplifier 10 according to a conventional technology.

FIG. 1 is a diagram illustrating an amplifier 10 according to a conventional technology. The amplifier 10 includes an input terminal 11, an input matching circuit 12, a stub circuit 13, a transistor 14, a stub circuit 15, an output matching circuit 16, and an output terminal 17.

The amplifier 10 is used, for example, as a power amplifier of a transmission unit of a smart phone terminal or a cellular phone terminal. The input terminal 11 receives a transmission signal as input from a baseband signal processing unit or the like of a smart phone terminal or a cellular phone terminal. The transmission signal is a signal in a what-is-called "two-tone form". The amplifier 10 amplifies the transmission signal input into the input terminal 11 to output the amplified signal from the output terminal 17.

The input matching circuit 12 is a circuit for taking impedance matching with a circuit connected with the input terminal 11. The input matching circuit 12 is provided for reducing loss by reflection when the transmission signal is input into the input terminal 11 from the circuit connected with the input terminal 11. The stub circuit 13 and the gate of the transistor 14 are connected with the output of the input matching circuit 12.

The stub circuit 13 is a circuit of a what-is-called "short stub form", and includes an inductor 13A and a capacitor 13B. A terminal of the inductor 13A is connected with the output terminal of the input matching circuit 12 and the gate of the transistor 14, and the other terminal of the inductor 13A is connected with a terminal of the capacitor 13B and a power source Vg. The other terminal of the capacitor 13B is grounded.

The power source Vg is a DC power source having the output voltage of Vg. The output voltage Vg is supplied to the gate of the transistor 14 as the gate voltage. The stub circuit 13 inputs the output voltage Vg of the power source Vg into the gate of the transistor 14.

The transistor 14 is, for example, an NMOS (N-channel Metal Oxide Semiconductor) transistor, the gate is connected with the input matching circuit 12 and the inductor 13A of the stub circuit 13, the source is grounded, and the drain is connected with the stub circuit 15. The transistor 14 amplifies a voltage input into the gate to output it from the drain.

The stub circuit 15 is a circuit of a what-is-called "short stub form", and includes an inductor 15A and a capacitor 15B. A terminal of the inductor 15A is connected with the output terminal of the input matching circuit 12 and the drain of the transistor 14, and the other terminal of the inductor 15A is connected with a terminal of the capacitor 15B and a power source Vg. The other terminal of the capacitor 15B is grounded.

The power source Vd is a DC power source having the output voltage of Vd. The output voltage Vd is supplied to the drain of the transistor 14. The stub circuit 15 inputs the output voltage Vd of the power source Vd into the drain of the transistor 14.

The output matching circuit 16 is a circuit for taking impedance matching with a circuit connected with the output terminal 17. The input terminal of the output matching circuit 16 is connected with the stub circuit 15 and the drain of the transistor 14. The output matching circuit 16 is provided for reducing loss by reflection when the transmission signal is output to the circuit connected with the output terminal 17.

As described above, the amplifier 10 is used, for example, as a power amplifier of a transmission unit of a smart phone terminal or a cellular phone terminal.

In general, a high-efficiency amplifier is used at the front end of a portable terminal, such as a smart phone terminal or a cellular phone terminal, to make the life of a battery longer. The efficiency η of an amplifier is represented by η=(Pout−Pin)/Pdc where Pin is power input into the amplifier, Pout is power output from the amplifier (the output of the amplifier), and Pdc is DC power consumed by the amplifier.

In this case, a higher efficiency is realized by using the amplifier 10 in a condition closer to a saturation power region to make Pout greater, which makes the numerator in the above formula greater.

However, the linearity of the amplifier is degraded around the saturation power, and hence, a signal out of a band may be generated, or signals in the band may be mixed to generate a distortion signal, which may result in cases where transmission quality of the signal is degraded.

Therefore, it is necessary for an amplifier for a portable terminal to reduce the distortion signal of the amplifier to achieve a high efficiency. If the transmission signal is a signal of a what-is-called "two-tone form", a distortion signal is generated that is called a "third inter-modulation distortion signal" (referred to as an "IM3 signal" below).

Next, using FIG. 2, a relationship between the output Pout, the efficiency η, and the strength of an IM3 signal of the amplifier 10 will be described according to the conventional technology illustrated in FIG. 1.

Figure 2:
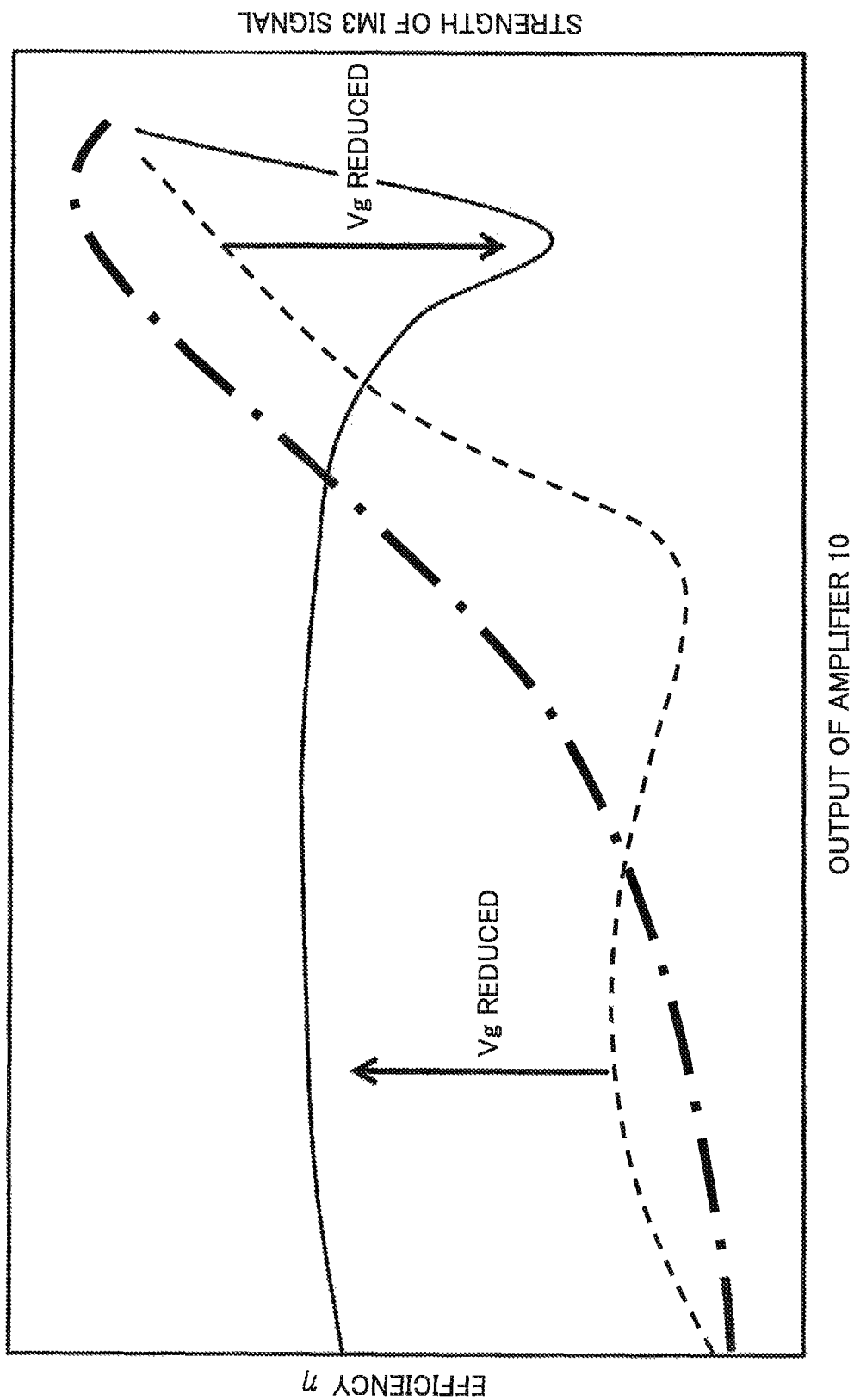
FIG. 2 is a diagram illustrating a relationship between an output Pout, an efficiency η, and the strength of an IM3 signal of the amplifier 10 according to the conventional technology.

FIG. 2 is a diagram illustrating the relationship between the output Pout, the efficiency η, and the strength of the IM3 signal of the amplifier 10 according to the conventional technology. In FIG. 2, the horizontal axis represents the output, of the amplifier 10, the vertical axis on the left side represents the efficiency η of the amplifier 10, and the vertical axis on the right side represents the strength of the IM3 signal of the amplifier 10. Also, a dashed-dotted line represents the efficiency η, a dashed line and a solid line represent the strength of the IM3 signal.

Here, the efficiency η of the amplifier 10 is represented by η=(Pout−Pin)/Pdc where Pin is power input into the amplifier 10, Pout is power output from the amplifier 10 (the output of the amplifier 10), and Pdc is DC power consumed by the amplifier 10.

The efficiency η represented by the dashed-dotted line monotonously increases as the output Pout increases, and takes a peak around the saturation power. Therefore, it is desirable to use the amplifier 10 in a high-output region as practicably as possible.

However, as illustrated by the dashed line in FIG. 2, the strength of the IM3 signal increases as the output Pout increases, and the amplifier 10 cannot be used around the saturation power.

This is because an upper limit value of the strength of an IM3 signal allowed for an amplifier 10 is stipulated by law in general. For example, in a band between 800 MHz and 2 GHz used for a portable terminal in Japan, it is obligated to make the strength of an IM3 signal less than or equal to −34 dBc with respect, to the signal strength of a transmission signal (fundamental wave signal) in the band. Namely, the allowed upper limit of the strength of an IM3 signal is −34 dBc in Japan.

Incidentally, the strength of an IM3 signal changes depending on the gate voltage Vg applied to the transistor 14 of the amplifier 10. FIG. 2 illustrates an example by the solid line that represents a characteristic of the signal strength of the IM3 when the gate voltage Vg is reduced.

When the gate voltage Vg is reduced, the strength of the IM3 signal increases in a region where the output Pout takes a low or an intermediate value. On the other hand, in a region where the output Pout is high, distortion is reduced, and a minimal value comes into existence.

In embodiments of the present invention described below, by using the dependency on the gate voltage Vg of the IM3 signal, an amplifier is provided that is operational around the saturation power where the efficiency of the amplifier is high while selecting an operational condition under which the strength of the IM3 signal is reduced.

In the following, amplifiers will be described according to the embodiments of the present invention.

First Embodiment

Figure 3:
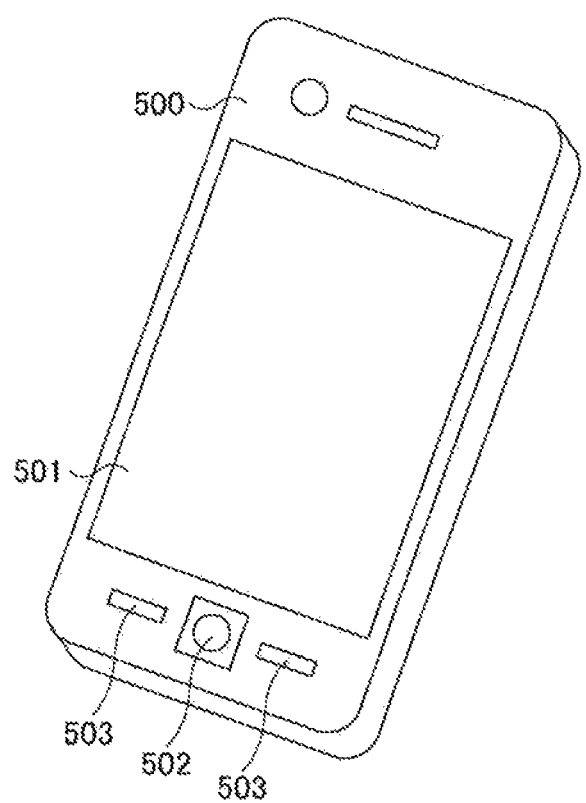
FIG. 3 is a perspective view of the front side of a smart phone terminal 500 including an amplifier according to a first embodiment.

FIG. 3 is a perspective view of the front side of a smart phone terminal 500 including an amplifier according to a first embodiment.

The smart phone terminal 500 including an amplifier of the first embodiment has a touch panel 501 disposed at the front side, and a home button 502 and switches 503 disposed below the touch panel 501.

Figure 4:
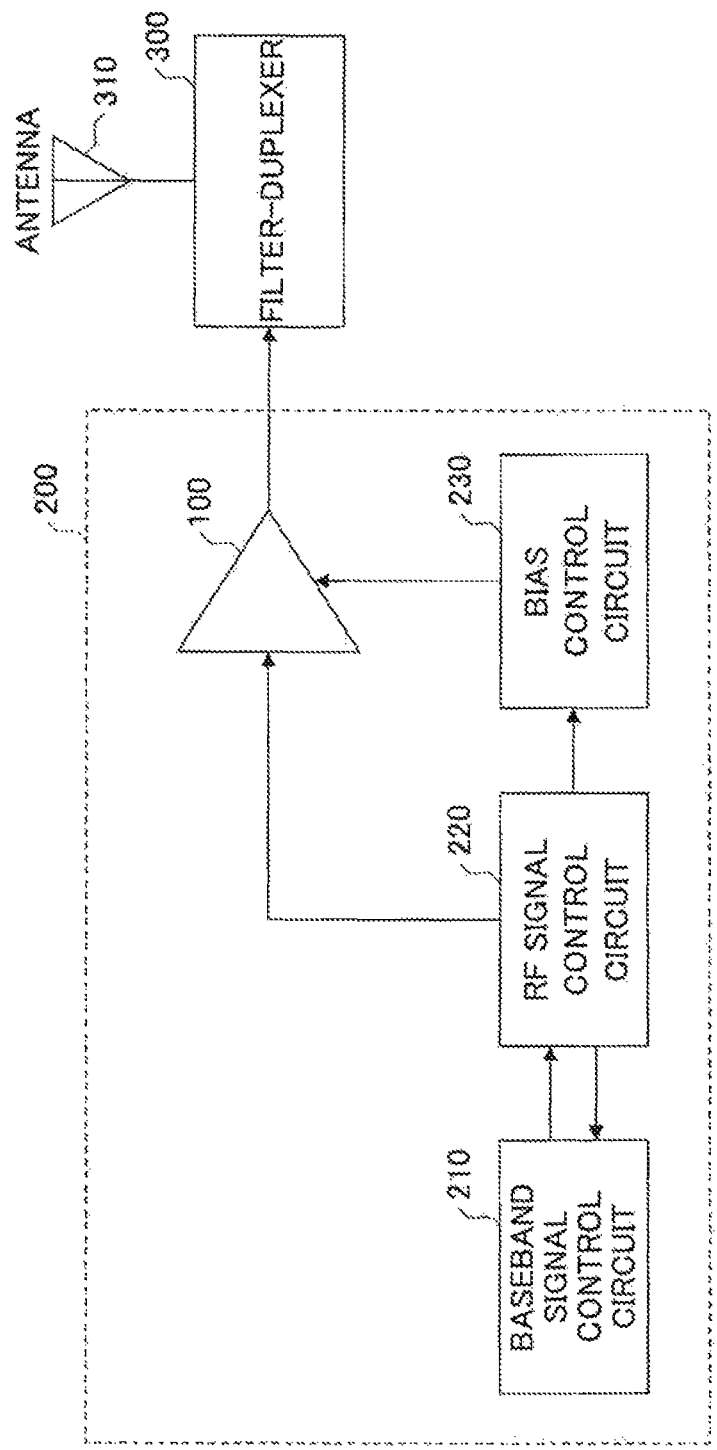
FIG. 4 is a diagram illustrating a transmission circuit 200 including an amplifier 100 according to the first embodiment.

FIG. 4 is a diagram illustrating a transmission circuit 200 including an amplifier 100 according to the first embodiment. The transmission circuit 200 includes a baseband signal control circuit 210, an RF (Radio Frequency) signal control circuit 220, a bias control circuit 230, and the amplifier 100. On the output side of the amplifier 100, a filter-duplexer 300 and an antenna 310 are connected.

A transmission signal having a baseband process applied at the baseband signal control circuit 210 has a modulation process applied at the RF signal control circuit 220 to be input into the amplifier 100. Also, a control signal is input from the RF signal control circuit 220 into the bias control circuit 230, and the bias control circuit 230 controls the output of the amplifier 100. The control signal input from the RF signal control circuit 220 into the bias control circuit 230 is a signal representing that the modulation process has been applied to the transmission signal by the RF signal control circuit 220, and is input into the bias control circuit 230 when the RF signal control circuit 220 has applied the modulation process to the transmission signal.

The transmission signal output from the amplifier 100 is transmitted to the antenna 310 via the filter-duplexer 300 that performs switching between transmission and reception, and radiated from the antenna 310.

The amplifier 100 in the first embodiment functions as a what-is-called "power amplifier" included in the transmission circuit 200.

Figure 5:
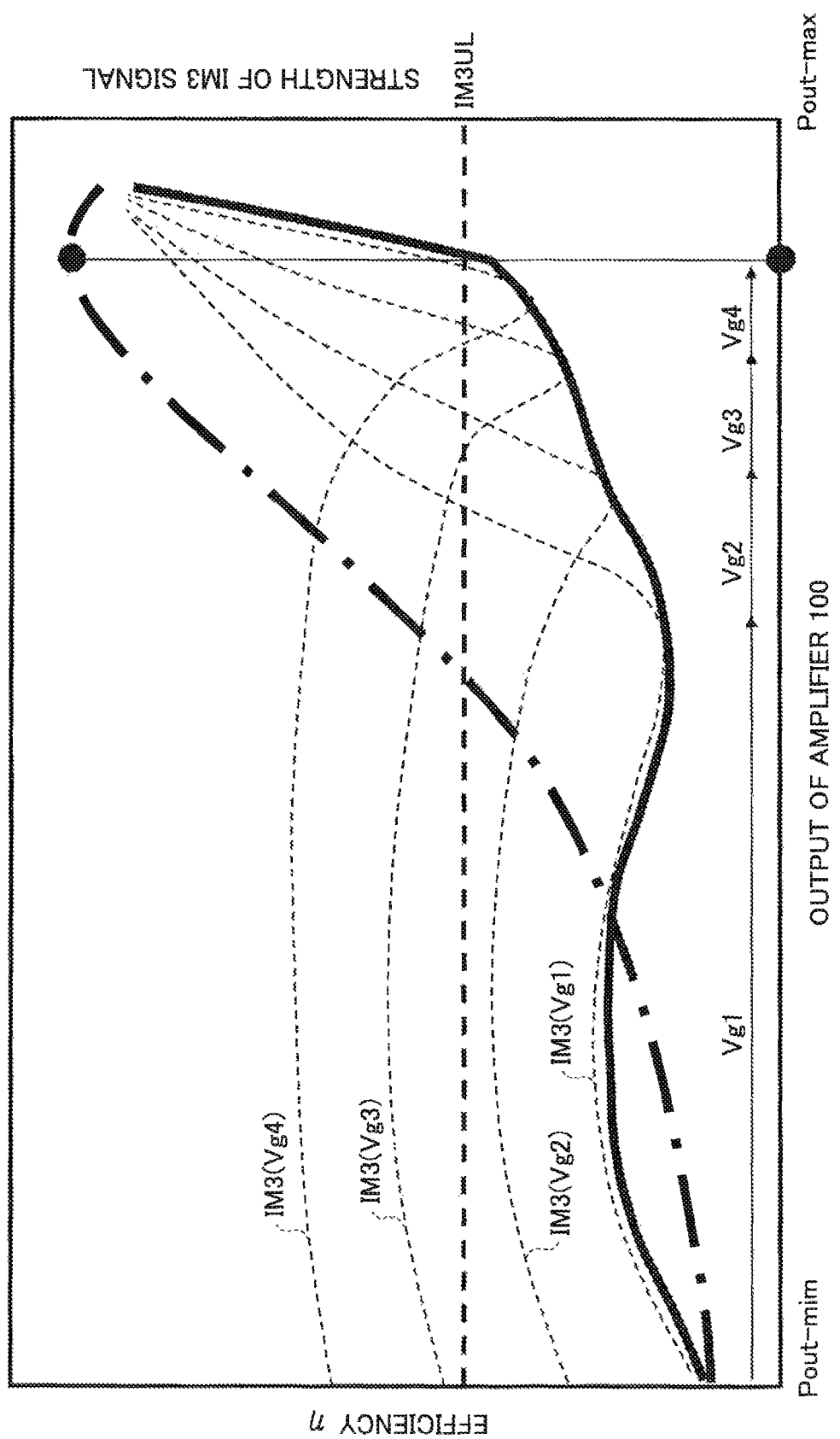
FIG. 5 is a diagram illustrating a state in which a region is selected where the strength of an IM3 signal is low by switching the gate voltage of a transistor in the amplifier 100 according to the first embodiment.

FIG. 5 is a diagram illustrating a state in which a region is selected where the strength of an IM3 signal is low by switching the gate voltage of a transistor in the amplifier 100 according to the first embodiment. In FIG. 5, the horizontal axis represents the output of the amplifier 100, the vertical axis on the left side represents the efficiency η of the amplifier 100, and the vertical axis on the right side represents the strength of the IM3 signal of the amplifier 100. Also, a dashed-dotted line represents the efficiency η, four dashed lines represent the strength of the IM3 signal. Note that the strength of the IM3 signal illustrated in FIG. 5 is measured by a spectrum analyzer.

Also, Pout-min on the horizontal axis represents a minimum output value of the amplifier 100, and Pout-max represents a maximum output value of the amplifier 100. IM3UL on the vertical axis of the right side represents an allowed upper limit of the strength of the IM3 signal.

The four dashed lines represent characteristics IM3(Vg1) to IM3(Vg4) of the strength of the IM3 signal with respect to the output of the amplifier 100 obtained by four types of the gate voltages Vg1 to Vg4. The gate voltages Vg1 to Vg4 are in a relationship in which the voltage value is reduced from Vg1 to Vg4. Namely, the relationship of Vg1>Vg2>Vg3>Vg4(>Vth) is satisfied. Here, Vth is a threshold of the transistor included in the amplifier 100.

Among the characteristics IM3(Vg1) to IM3(Vg4) in a region where the output of the amplifier 100 is low (a region between the minimum output value Pout-min and an intermediate point to the maximum output value Pout-max), the strength of IM3(Vg1) is the lowest, the strength of IM3 (Vg4) is the highest. Namely, in the region where the output of the amplifier 100 is low, the strength of the IM3 signal is higher for IM3(Vg1), IM3(Vg2), IM3(Vg3), and IM3(Vg4) in order.

In addition, in this region, IM3(Vg1) and IM3(Vg2) are lower than the allowed upper limit IM3UL, whereas IM3 (Vg3) and IM3(Vg4) are higher than the allowed upper limit IM3UL.

On the other hand, in the region where the output of the amplifier 100 is high, the strength takes a minimal value for each of IM3(Vg1), IM3(Vg2), IM3(Vg3), and IM3(Vg4), and the output regions where the minimal values are generated are shifted toward the high-output side (the right side in FIG. 5) in order of IM3(Vg1), IM3(Vg2), IM3(Vg3), and IM3(Vg4).

In addition, the signal strength around the minimal value of each of IM3(Vg1), IM3(Vg2), IM3(Vg3), and IM3(Vg4) is lower than the allowed upper limit IM3UL.

Therefore, when the output of the amplifier 100 increases from the minimum output value Pout-min to the maximum output value Pout-max, the strength of the IM3 signal can be set less than or equal to the allowed upper limit IM3UL in the almost, entire output region as designated by a thick solid line if the gate voltage is continuously reduced to be Vg1, Vg2, Vg3, and Vg4 as designated by arrows along the horizontal axis.

The amplifier 100 in the first embodiment reduces the strength of the IM3 signal by this principle.

Therefore, at mechanism is required with which the gate voltage of the transistor in the amplifier 100 can be adjusted so that the strength of the IM3 signal is less than or equal to the allowed upper limit IM3UL in the almost entire output, region with a simple configuration.

Next, using FIGS. 6A-7B, a method of detecting the strength of the IM3 signal will be described.

FIGS. 6A-7B are diagrams illustrating a method of detecting the strength of the IM3 signal according to the first embodiment. Note that the amplifier 1 for comparison illustrated in FIG. 6A differs from the amplifier 100 in the first embodiment in that it applies a constant gate voltage to its internal transistor.

As illustrated in FIG. 6A, when inputting a signal of a two-tone form having angular frequencies $\omega_1$ and $\omega_2$ into the amplifier 1, the amplifier 1 outputs a fundamental wave signal ($\omega_1$, $\omega_2$) as data, and in addition, an IM3 signal, a double harmonic wave signal, and a triple harmonic wave signal as illustrated in FIG. 6B. The double harmonic wave signal and the triple harmonic wave signal are higher harmonics of the fundamental wave signal ($\omega_1$, $\omega_2$).

The IM3 signal, the double harmonic wave signal, and the triple harmonic wave signal are represented by terms in an n-th order (where n is an integer greater than one) polynomial represented by Formula (1). Note that, as it is difficult to illustrate all terms in an n-th order polynomial, only a part of terms is illustrated in Formula (1).

$$(\mathrm{Sin}(\omega_1 t)+\mathrm{Sin}(\omega_2 t))^n = A(\mathrm{Sin}(\omega_1 t)+\mathrm{Sin}(\omega_2 t))+B(\mathrm{Sin}(2\omega_1 t-\omega_2 t)+\mathrm{Sin}(\omega_1 t-2\omega_2 t))+C(\mathrm{Sin}(2\omega_1 t)+\mathrm{Sin}(2\omega_2 t))+\ldots \quad (1)$$

It is difficult to directly detect the strength of the IM3 signal because the frequency of the IM3 signal is close to the frequency of the fundamental wave signal ($\omega_1$, $\omega_2$) as illustrated in FIG. 6B.

Figure 7A:
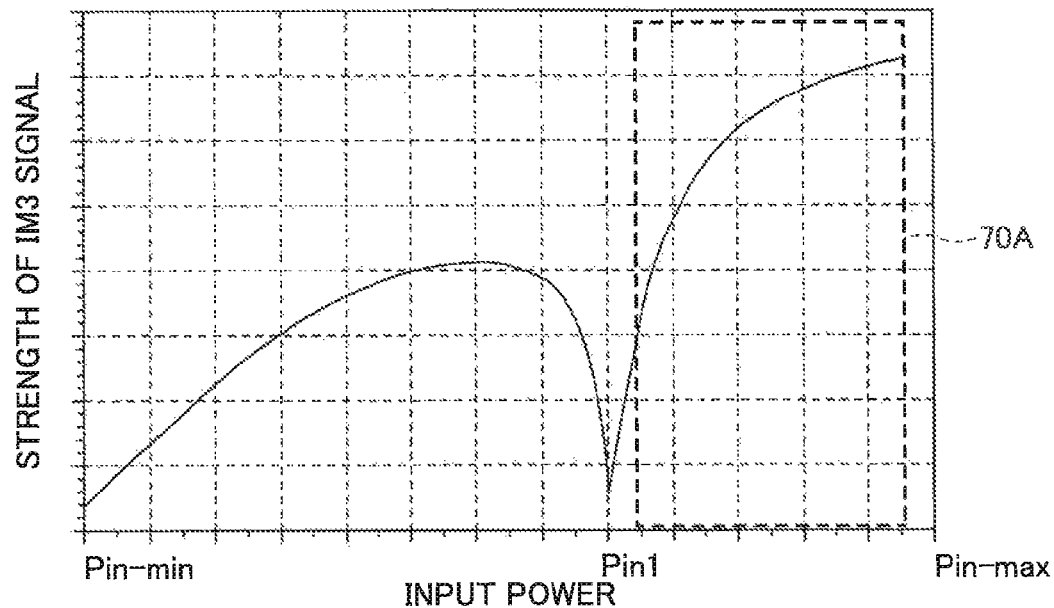
FIGS. 7A-7B are diagrams illustrating a method of detecting the strength of the IM3 signal in the amplifier 100 according to the first embodiment.

FIG. 7A illustrates an example of a characteristic of the strength of the IM3 signal with respect to the input power of the amplifier 1 (see FIG. 6A). The strength of the IM3 signal illustrated in FIG. 7A is a strength of the IM3 signal included in a signal leaked out of the input terminal of the amplifier 1 (see FIG. 6A).

As illustrated in FIG. 7A, the IM3 signal leaked out of the input terminal of the amplifier 1 (see FIG. 6A) has a characteristic where the strength increases while the input power increases from the minimum value Pin-min toward the maximum value Pin-max, then goes down to take a minimal value at Pin1, and increases again after that.

Figure 7B:
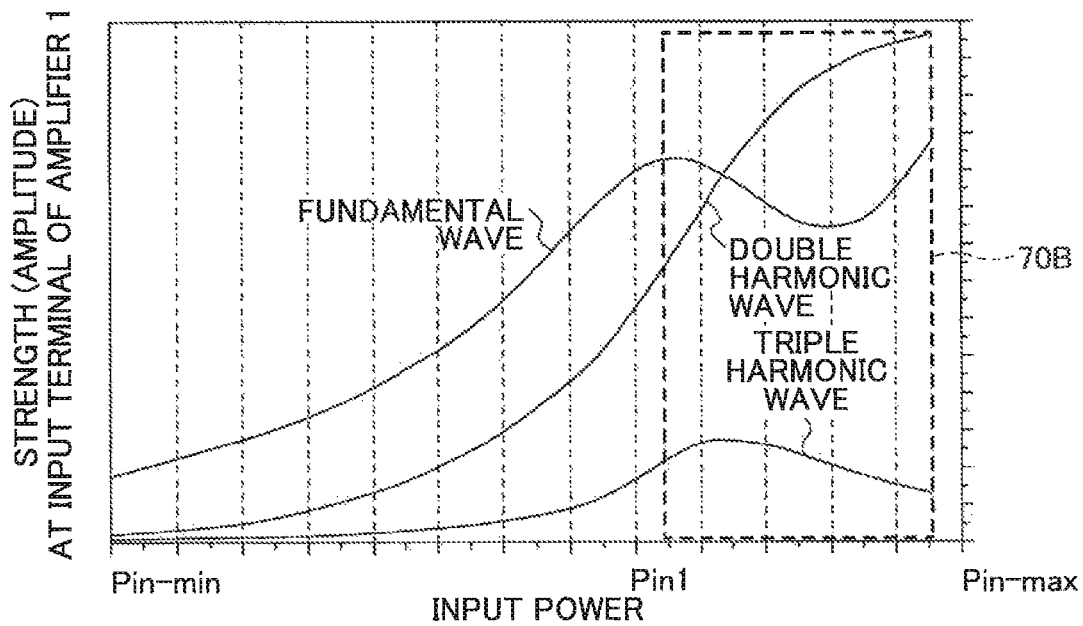

Also, FIG. 7B illustrates an example of characteristics of the strengths (amplitudes) of the fundamental wave, the double harmonic wave, and the triple harmonic wave, respectively, with respect to the input power of the amplifier 1 (see FIG. 6A). The strengths of the fundamental wave, the double harmonic wave, and the triple harmonic wave here are strengths of the fundamental wave, the double harmonic wave, and the triple harmonic wave included in a signal leaked out of the input terminal of the amplifier 1 (see FIG. 6A).

As illustrated in FIG. 7B, the fundamental wave and the triple harmonic wave included in the signal leaked out of the input terminal of the amplifier 1 (see FIG. 6A) basically increase while the input power increases from the minimum value Pin-min to the maximum value Pin-max, but they go down beyond Pin1.

On the other hand, the double harmonic wave leaked out of the input terminal of the amplifier 1 (see FIG. 6A) increases from the minimum value Pin-min to the maximum value Pin-max, and increases faster beyond Pin1.

Note that it is a high-output region of the amplifier 1 (see FIG. 6A) where the strength of the IM3 signal needs to be reduced specifically. This is because the strength of the IM3 signal increases in a high-output region while the efficiency is improved in the high-output region as described with the conventional technology using FIG. 2.

The IM3 signal illustrated in FIG. 7A and the double harmonic wave illustrated in FIG. 7B has a correlation in the high-output region (the higher output side of Pin1), and tend to monotonously increase. Therefore, it is possible to estimate the strength of the IM3 signal (amplitude) based on the strength (amplitude) of the double harmonic wave signal leaked out of the input terminal of the amplifier 1 (see FIG. 6A).

Therefore, the amplifier 100 in the first embodiment (see FIG. A) performs its drive operation especially in the compensation region 70A or 70B on the high-output side designated by dashed lines in FIGS. 7A-7B. However, an operational regions of the amplifier 100 in first embodiment is not limited to the compensation region 70A or 70B, but it may be a region having a lower output than in the compensation region as long as the strength of the IM3 signal is sufficiently low.

Namely, the amplifier 100 in the first embodiment performs its drive operation at least in the compensation region 70A or 70B on the higher-output side designated by the dashed lines in FIGS. 7A-7B.

Next, a circuit configuration of the amplifier 100 in the first embodiment will be described using FIG. 8.

Figure 8:
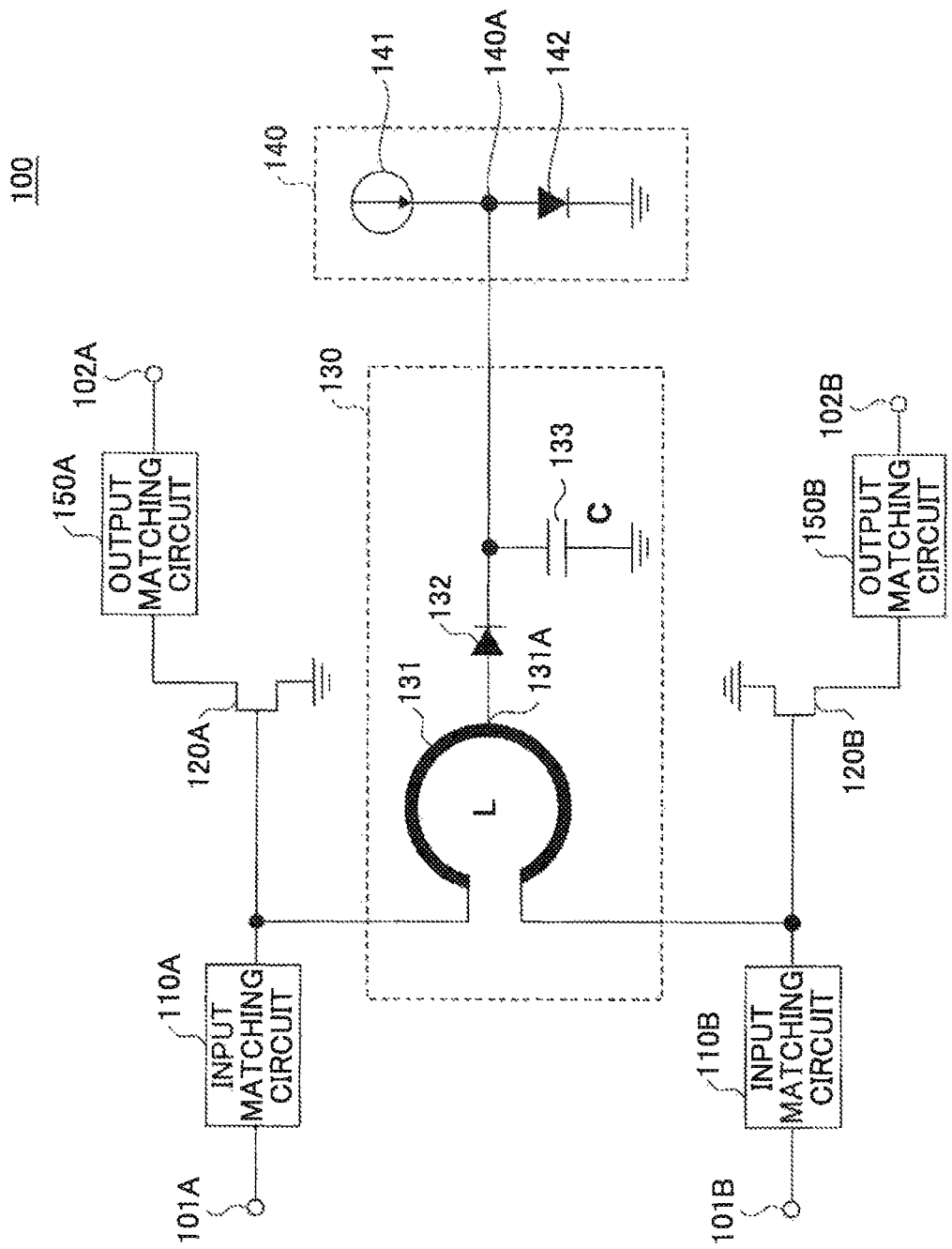
FIG. 8 is a diagram illustrating the amplifier 100 according to the first embodiment.

FIG. 8 is a diagram illustrating the amplifier 100 according to the first embodiment. Amplifier 100 amplifies a differential transmission signal to output a differential output signal.

The amplifier 100 includes input terminals 101A and 101B, output terminals 102A and 102B, the input matching circuits 110A and 110B, transistors 120A and 120B, a gate voltage control unit 130, a gate voltage generation unit 140, and output matching circuits 150A and 150B.

In the first embodiment, the amplifier 100 is used, for example, as a power amplifier included in a transmission circuit 200 (see FIG. 4) of a smart phone terminal 500 (see FIG. 3).

The input terminals 101A and 101B receive a transmission signal as input from the RF signal control circuit 220 illustrated in FIG. 4. The transmission signal is a differential signal in a what-is-called "two-tone form". The amplifier 100 amplifies the transmission signal input into the input terminals 101A and 101B to output the amplified signal from output terminals 102A and 102B.

The input matching circuits 110A and 110B are circuits for taking impedance matching with a circuit connected with the input matching circuits 110A and 110B. The input matching circuits 110A and 110B are provided for reducing loss by reflection when the transmission signal is input into the input matching circuits 110A and 110B from the circuit connected with the input matching circuits 110A and 110B. The output sides of the input matching circuits 110A and 110B are connected with the gates of the transistors 120A and 120B and the gate voltage control unit 130.

The transistors 120A and 120B are, for example, NMOS (N-channel Metal Oxide Semiconductor) transistors, the gates are connected with the input matching circuits 110A and 110B and the gate voltage control unit 130, the sources are grounded, and the drains are connected with the output matching circuits 150A and 150B. The transistors 120A and 120B amplify voltages input into the gates to output them from the drains.

The gate voltage control unit 130 is provided for controlling the gate voltage applied to the gates of the transistors 120A and 120B via the gate voltage control unit 130 from the gate voltage generation unit 140.

Here, Vg represents the gate voltage applied to the gates of the transistors 120A and 120B, δVg is an adjustment amount of the voltage (adjustment voltage) output from both terminals of an inductor 131 of the gate voltage control unit 130, and Vg0 is an initial value of the gate voltage output from the gate voltage generation unit 140 and input into a connection point, between a diode 132 and a capacitor 133. The gate voltage Vg applied to the gates of the transistors 120A and 120B is represented by Formula (2) below.

$$Vg = Vg0 + \delta Vg \quad (2)$$

The gate voltage control unit 130 includes the inductor 131, the diode 132, and the capacitor 133. The inductor 131 is a coil having a center tap 131A. Both terminals of the inductor 131 are connected with the input matching circuits 110A and 110B, and the gates of the transistors 120A and 120B, respectively. Also, the center tap 131A is connected with the anode of the diode 132.

The center tap 131A of the inductor 131 is positioned at the middle point between both terminals of the inductor 131. Also, the inductor 131 has an inductance L set to configure an LC resonance circuit with the capacitor 133. The resonance frequency of the LC resonance circuit is set to the frequency (2f) of the double harmonic wave. The frequency (2f) of the double harmonic wave is twice the frequency (f) of the fundamental wave.

This is to make the signal of the double harmonic wave output from the center tap 131A entirely applied to both terminals of the diode 132, by selecting values of the inductance L of the inductor 131 and the capacitance C of the capacitor 133 so that the impedance is zero (shorted) with respect to the double harmonic wave. Note that such values of the inductance L of the inductor 131 and the capacitance C of the capacitor 133 satisfy $2f = \frac{1}{2\pi\sqrt{LC}}$.

Therefore, the double harmonic wave of the fundamental wave of the transmission signal is output from the center tap 131A to the diode 132, whereas odd-numbered order components such as the fundamental wave and the triple harmonic wave are not output from the center tap 131A because it is virtually a grounding point for the odd numbered order components.

Note that this naturally implies that if the IM3 signal is leaked out of the gates of the transistors 120A and 120B, it is not output from the center tap 131A. As for even-numbered components such as a quadruple harmonic wave or greater, they are not detected at the center tap 131A because the impedance of the center tap 131A is not zero (not shorted) for these components.

Thus, only the double harmonic wave is output from the center tap 131A of the inductor 131 to the diode 132.

The diode 132 has its anode connected with the center tap 131A of the inductor 131, and its cathode connected with one of the terminals of the capacitor 133 and the output terminal 140A of the gate voltage generation unit 140.

The diode 132 is provided for controlling the gate voltage of the transistors 120A and 120B depending on the strength of the double harmonic wave (amplitude) output from the center tap 131A of the inductor 131. Operations of the diode 132 will be described later.

The capacitor 133 has one of its terminals connected with the cathode of the diode 132 and the output terminal 140A of the gate voltage generation unit 140, and the other terminal grounded. As described above, the capacitance C of the capacitor 133 is set to a value with which an LC resonance circuit is configured along with the inductor 131.

Note that the adjustment voltage δVg output by the gate voltage control unit 130 to the gate of the transistors 120A and 120B is generated when the output side voltage of the diode 132 is changed by a clipping circuit including the diode 132 as the strength of the transmission signal (amplitude) input into the input terminals 101A and 101B increases. The clipping circuit includes the diode 132 and the gate voltage generation unit 140.

In the amplifier 100 in the first embodiment, when the strength of the transmission signal (amplitude) input into the input terminals 101A and 101B increases, the adjustment voltage δVg is reduced that is output by the gate voltage control unit 130 to the gates of the transistors 120A and 120B.

The adjustment, voltage δVg is set so that it is zero (0) when the strength of the transmission signal (amplitude) is at an initial value, and when the strength of the transmission signal (amplitude) increases from the initial value, the adjustment voltage δVg output by the gate voltage control unit 130 to the gate of the transistors 120A and 120B takes a negative value.

The gate voltage generation unit 140 includes a constant current source 141 and a diode 142. The output terminal of the constant current source 141 is connected with the anode of the diode 142, and the cathode of the diode 142 is grounded. The output terminal 140A of the gate voltage generation unit 140 is a connection point of the output terminal of the constant current source 141 and the anode of the diode 142.

The gate voltage generation unit 140 outputs the initial value Vg0 of the gate voltage of the transistors 120A and 120B from the output terminal 140A. The value of the initial value Vg0 will be described later.

The output matching circuits 150A and 150B are circuits for taking impedance matching with the filter-duplexer 300 connected with the output terminals 102A and 102B. The input terminals of the output matching circuits 150A and 150B are connected with the drains of the transistors 120A and 120B. The output matching circuits 150A and 150B are provided for reducing loss by reflection when the transmission signal is output to the filter-duplexer 300 connected with the output terminals 102A and 102B.

In the amplifier 100 configured as above, when the strength of the transmission signal input into the input terminals 101A and 101B changes, the adjustment voltage δVg output by the gate voltage control unit 130 changes to realize the following operations. FIGS. 9A-9D are used in addition to FIG. 8 in the description below.

FIGS. 9A-9D are diagrams illustrating a state where the adjustment voltage δVg is generated by the diode 132. FIG. 9A is a simplified configuration diagram of the amplifier 100. FIGS. 9B-9C are equivalent circuit diagrams of FIG. 9A, and FIG. 9D illustrates a waveform on the output-side of the diode 132.

In FIG. 9A, the input matching circuits 110A and 110B are connected with a signal source 50 that outputs a transmission signal. Also, the inductor 131 is designated by a symbol of a coil, and the transistors 120A and 120B are designated as a capacitor Cgs. The amplifier 100 includes the diode 132 and the clipping circuit having the gate voltage generation unit 140.

When the gate voltage Vg is less than the initial value Vg0 (Vg<Vg0), the diode 132 is off, and the equivalent circuit of the amplifier 100 in this case is FIG. 9B. This is because a reverse bias applied to the diode 132 makes the output terminal side of the diode 132 appear open rather than the input terminal side.

On the other hand, when the gate voltage Vg is greater than the initial value Vg0 (Vg>Vg0), the diode 132 is on, and the equivalent circuit of the amplifier 100 in this case is FIG. 9C. Namely, the diode 132 can be treated as a resistor having residual resistance when turned on.

In the amplifier 100 illustrated in FIG. 8, the transmission signal through the input matching circuits 110A and 110B is input into the inductor 131 to generate a resonance of a double harmonic wave component. At this moment, the diode 132 is turned on by the double harmonic wave of the transmission wave output from the center tap 131A of the inductor 131. Also, the transistors 120A and 120B amplify the transmission wave.

Also at this moment, the double harmonic wave input into the diode 132 has a sinusoidal waveform as designated by dashed lines in FIG. 9D. This double harmonic wave is clipped by the clipping circuit including the diode 132 as designated by a solid line in FIG. 9D, having a waveform clipped at parts where the voltage is higher than the on voltage of the diode 132, among positive-voltage parts of the double harmonic wave input into the diode 132. Therefore, on the output side of the diode 132, the DC component (DC level) of the double harmonic wave is reduced by the adjustment voltage δVg compared to the initial value Vg0 output by the gate voltage generation unit 140.

Also, at this moment, as the diode 132 is turned on, if the DC level of the output voltage of the diode 132 is reduced, the voltage on the input side of the diode 132 is also reduced. This makes the DC level on the input side of the diode 132 reduced by δVg. Note that although a voltage drop by the diode 132 may be strictly considered, it is neglected here.

Then, the voltage on the input side of the diode 132 is reduced more as the strength of the transmission signal (amplitude) input into the input terminals 101A and 101B increases from the initial value more. This is because the adjustment voltage δVg is reduced, to take a negative value as the strength of the transmission signal (amplitude) input into the input terminals 101A and 101B increases from the initial value more.

Therefore, in the amplifier 100 in the first embodiment, when the strength of the transmission signal (amplitude) input into the input terminals 101A and 101B increases from the initial value, the voltage on the input side of the diode 132 is reduced, and the adjustment voltage δVg takes a negative value.

This makes the gate voltage Vg input into the gate of the transistors 120A and 120B reduced less than the initial value Vg0 as represented by Formula (2).

Note that when the strength of the transmission signal (amplitude) increases from the initial value, the gate voltage Vg is reduced by the adjustment voltage δVg. Therefore, if setting is made to take a value less than or equal to the allowed upper limit of the strength of the IM3 signal IM3UL, it is possible to drive the amplifier 100 under an operational condition where the strength of the IM3 signal is low when driving the amplifier 100.

Namely, using the gate voltage Vg reduced along with the reduction of the adjustment voltage δVg, and by driving the transistors 120A and 120B at an operational point in the neighborhood, of the minimal value of the IM3 signal, it is possible to drive the amplifier 100 under an operational condition where the strength of the IM3 signal is less than or equal to the allowed upper limit IM3UL.

Reduction of the adjustment voltage δVg makes the gate voltage of the transistors 120A and 120B reduced, which corresponds to a rightward (toward the high-output side) shift of the minimal value of the IM3 signal in FIG. 9.

The efficiency η of the amplifier 100 increases monotonously along with the increase of the output Pout, and takes a peak around the saturation power. Therefore, it is desirable to use the amplifier 10 in a high-output region as practicably as possible.

However, it is difficult for the amplifier 10 in the conventional technology (see FIG. 1) to operate in a high-output region because the strength of the IM3 signal increases along with the increase of the output Pout.

In contrast to this, in the amplifier 100 in the first embodiment, it is possible to drive the amplifier 100 in an operational region where the strength of the IM3 signal is low, by detecting the double harmonic wave of the transmission signal, and adjusting the gate voltage of the transistors 120A and 120B based on the double harmonic wave of the transmission signal.

Driving the amplifier 100 in an operational region where the strength of the IM3 signal is low by adjusting the gate voltage of the transistors 120A and 120B in this way is especially effective when driving the amplifier 100 in a high-output region.

Figure 10:
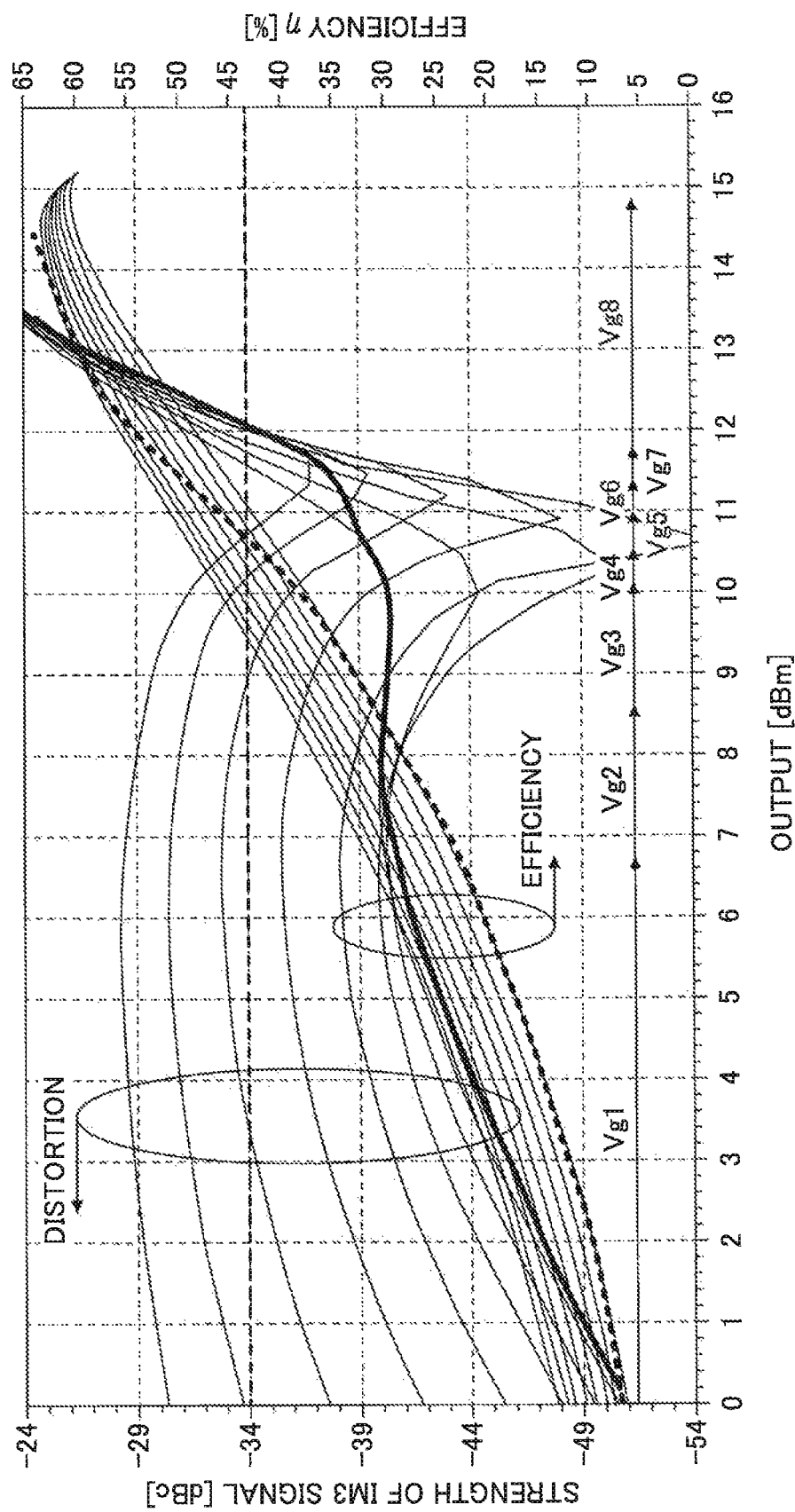
FIG. 10 is a diagram illustrating selection of a region where the strength of the IM3 signal is low by switching the gate voltage of transistors 120A and 120B in the amplifier 100 according to the first embodiment.

Here, effects of the amplifier 100 of the first embodiment will be further described in detail using FIG. 10.

FIG. 10 is a diagram illustrating selection of a region where the strength of the IM3 signal is low by switching the gate voltage of the transistors 120A and 120B in the amplifier 100 according to the first embodiment. In FIG. 10, the horizontal axis represents the output of the amplifier 100 (output power), the vertical axis on the left side represents the strength of the IM3 signal of the amplifier 100, and the vertical axis on the right side represents the efficiency η of the amplifier 100. Also, a dashed line represents the efficiency η, eight lines having steep flexures represent the strength of the IM3 signal. IM3UL (−34 dBc) on the vertical axis on the left side represents an allowed upper limit of the strength of the IM3 signal.

The eight lines represent characteristics of the strength of the IM3 signal with respect to the output of the amplifier 100 obtained by eight types of the gate voltages Vg1 to Vg8. The gate voltages Vg1 to Vg8 are in a relationship in which the voltage value is reduced from Vg1 to Vg8. Namely, the relationship of Vg1>Vg2>Vg3>Vg4>Vg5>Vg6>Vg7>Vg8 (>Vth) is satisfied. Here, Vth is a threshold of the transistors 120A and 120B.

Therefore, if the diode 132 is made to have a forward directional characteristic to output δVg for realizing the characteristics Vg1 to Vg8 illustrated in FIG. 9, the amplifier 100 of the first embodiment can obtain a characteristic where the IM3 signal is reduced as illustrated FIG. 9.

Thus, according to the first embodiment, it is possible to provide an amplifier 100 having a simple configuration, and operational in a region where distortion is small.

Note that it is assumed in the above description that the transistors 120A and 120B have the characteristic where the minimal value of the IM3 signal is shifted toward the high-output side as the gate voltage is reduced more. However, depending on a type of the transistor used as the transistors 120A and 120B, they may have a reverse characteristic to the above. Namely, there may be a case where the minimal value of the IM3 signal is shifted toward the high-output side as the gate voltage is increased more.

In such a case, the diode 132 may be connected in a direction reverse to that in FIG. 8 to select an operational condition under which the strength of the IM3 signal is reduce. Operations in this case will be described using FIG. 11.

FIGS. 11A-11D are diagrams illustrating a state where an adjustment voltage δVg is generated by a diode 132A. An amplifier 100A in FIG. 11 differs from the amplifier 100 illustrated in FIG. 9 in that a gate voltage control unit 130A is included instead of the gate voltage control unit 130 illustrated in FIG. 9, and the characteristic of transistors 120A and 120B differ from that of the amplifier 100 illustrated in FIG. 9.

Figure 11:
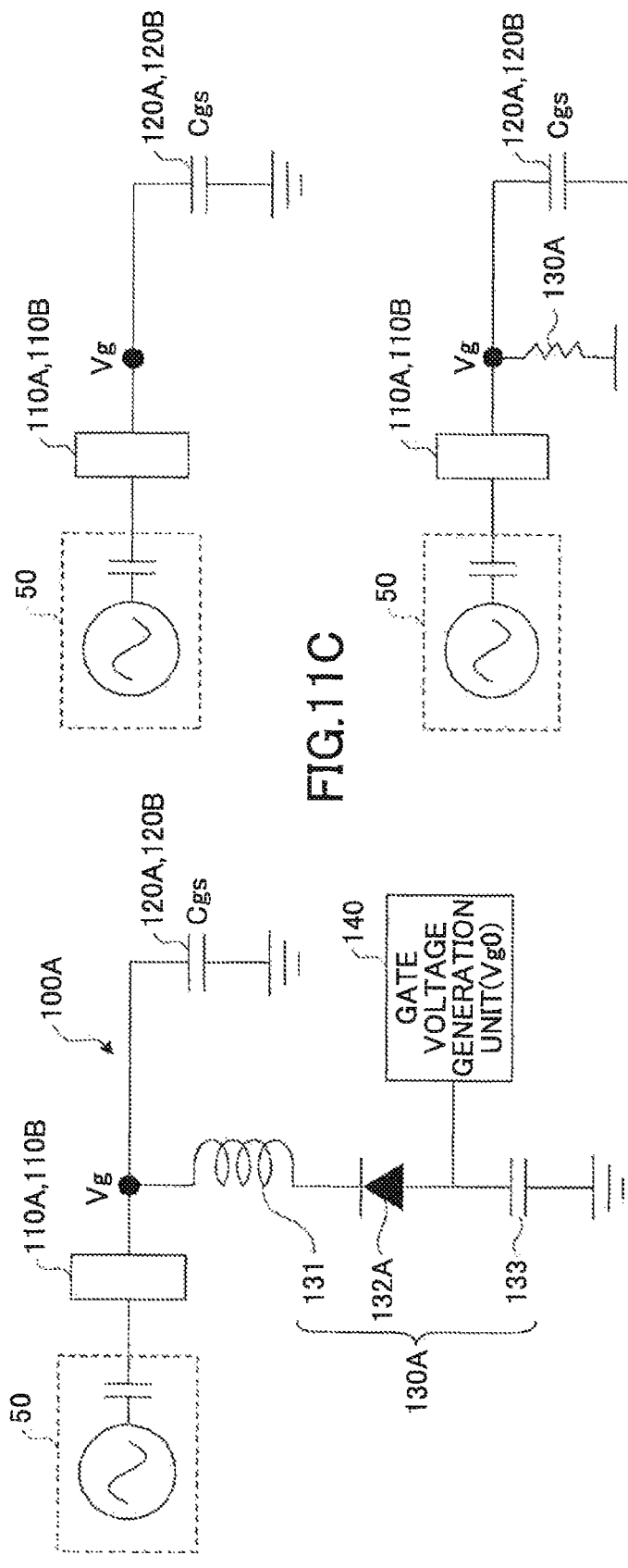
FIGS. 11A-11D are diagrams illustrating a state where an adjustment voltage δVg is generated by a diode 132A.

The transistors 120A and 120B illustrated in FIG. 11 have the characteristic where the minimal value of the IM3 signal is shifted toward the high-output side as the gate voltage is increased more. Namely, when the gate voltage changes, the minimal value of the IM3 signal changes in a direction reverse to that illustrated in FIG. 9 for the transistors 120A and 120B.

FIG. 11A is a simplified configuration diagram of the amplifier 100A. FIGS. 11B-11C are equivalent circuit diagrams of FIG. 11A, and FIG. 11D illustrates a waveform on the output side of the diode 132A.

The amplifier 100A illustrated in FIG. 11A differs from the amplifier 100 illustrated in FIG. 9A in that the connection direction of the diode 132A is reversed.

When the gate voltage Vg is greater than the initial value Vg0 (Vg>Vg0), the diode 132A is off, and the equivalent circuit of the amplifier 100A in this case is FIG. 11B. This is because a reverse bias applied to the diode 132A makes the input terminal side of the diode 132A appear open rather than the output terminal side.

On the other hand, when the gate voltage Vg is less than the initial value Vg0 (Vg<Vg0), the diode 132A is on, and the equivalent circuit of the amplifier 100A in this case is FIG. 11C. Namely, the diode 132A can be treated as a resistor having residual resistance when turned on.

In the amplifier 100A, the transmission signal through the input matching circuits 110A and 110B is input into the inductor 131 to generate a resonance of a double harmonic wave component. Also, the diode 132A is turned on by the gate voltage generation unit 140. Also, the transistors 120A and 120B amplify the transmission wave.

Also at this moment, the double harmonic wave input into the diode 132A has a sinusoidal waveform as designated by dashed lines in FIG. 11D. This double harmonic wave is clipped by a clipping circuit including the diode 132A as designated by a solid line in FIG. 11D, having a waveform clipped at parts where the voltage of the double harmonic wave input into the diode 132A is negative. Note that negative-voltage remains a bit more for the on-voltage of the diode 132A in FIG. 11D. Therefore, on the output side of the diode 132A, the DC component (DC level) of the double harmonic wave is raised by the adjustment voltage δVg compared to the initial value Vg0 output by the gate voltage generation unit 140. Note that although a voltage drop by the diode 132A may be strictly considered, it is neglected here.

Then, the voltage on the input side of the diode 132A is increased more as the strength of the transmission signal (amplitude) input into the input terminals 101A and 101B increases more from the initial value. This is because the DC level of the voltage on the input side of the diode 132A is increased more as the strength of the transmission signal (amplitude) input into the input terminals 101A and 101B increases more from the initial value.

Therefore, in the amplifier 100A in the first embodiment, when the strength of the transmission signal (amplitude) input into the input terminals 101A and 101B increases from the initial value, the DC level of the voltage on the input side of the diode 132A is increased.

This makes the gate voltage Vg input into the gate of the transistors 120A and 120B is raised greater than the initial value Vg0.

Note that when the strength of the transmission signal (amplitude) increases from the initial value, the gate voltage Vg is increased by the adjustment voltage δVg. Therefore, if setting is made to take a value less than or equal to the allowed upper limit of the strength of the IM3 signal IM3UL, it is possible to drive the amplifier 100A under an operational condition where the strength of the IM3 signal is low when driving the amplifier 100A.

Namely, using the gate voltage Vg increased along with the increase of the adjustment voltage δVg, and by driving the transistors 120A and 120B at an operational point in the neighborhood of the minimal value of the IM3 signal, it is possible to drive the amplifier 110A under an operational condition where the strength of the IM3 signal is less than or equal to the allowed upper limit IM3UL.

As above, if the minimal value of the IM3 signal is shifted toward the high-output side as the gate voltage is increased, the diode 132A may have the cathode connected with the signal source 50 and the gates of the transistors 120A and 120B, and the anode connected with the gate voltage generation unit 140 and the capacitor 133.

Second Embodiment

Figure 12:
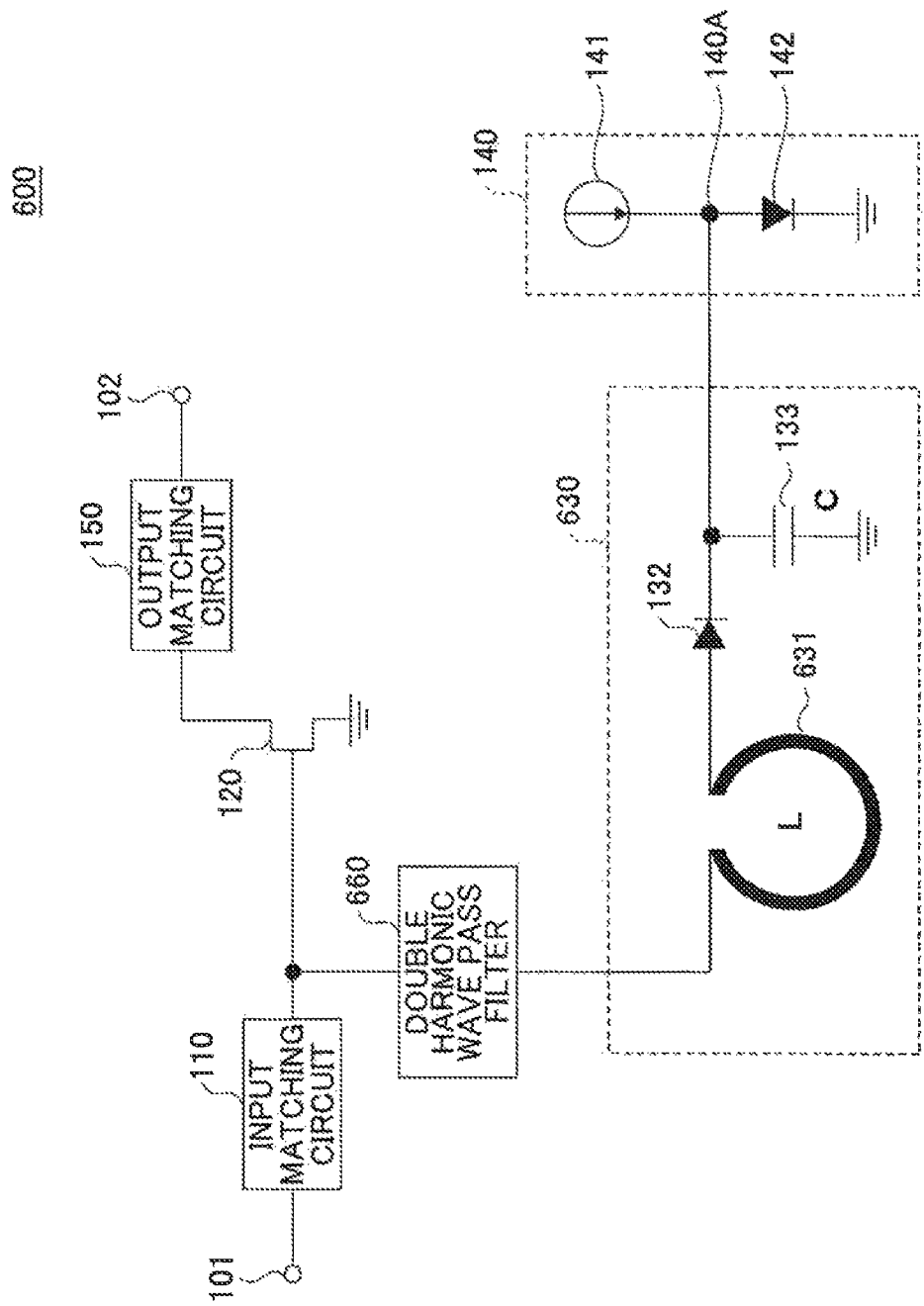
FIG. 12 is a diagram illustrating an amplifier 600 according to a second embodiment.

FIG. 12 is a diagram illustrating an amplifier 600 according to a second embodiment. The amplifier 600 in the second embodiment differs from the amplifier 100 in the first embodiment (see FIG. 8) in that it amplifies a single-ended transmission signal. Therefore, the same elements as those included in the amplifier 100 in the first embodiment are assigned the same numerical codes except that alphabetical suffixes A or B are removed, and their description may not be repeated.

The amplifier 600 includes an input terminal 101, an output terminal 102, an input matching circuit 110, a transistor 120, a gate voltage control unit 630, a gate voltage generation unit 140, and an output matching circuit 150.

In the second embodiment, the amplifier 600 is used, for example, as a power amplifier included in a transmission circuit 200 (see FIG. 4) of a smart phone terminal 500 (see FIG. 3).

The input terminal 101 receive a transmission signal as input from the RF signal control circuit 220 illustrated in FIG. 4. The transmission signal is a single-ended signal in a what-is-called "two-tone form". The amplifier 600 amplifies the transmission signal input into the input terminal 101 to output the amplified signal from the output terminal 102.

The output side of the input matching circuit 110 is connected with the gate of the transistor 120 and the double harmonic wave pass filter 660.

The double harmonic wave pass filter 660 is provided between the input, matching circuit 110, the gate of the transistor 120, and one of the terminals of an inductor 631 of a gate voltage control unit 630, which is a filter to pass only a double harmonic wave. The double harmonic wave pass filter 660 may be a filter, for example, that transmits the double harmonic wave of a transmission signal and an adjustment voltage δVg.

The double harmonic wave pass filter 660 may be a filter having a circuit configuration, for example, as illustrated in FIG. 13.

Figure 13A:
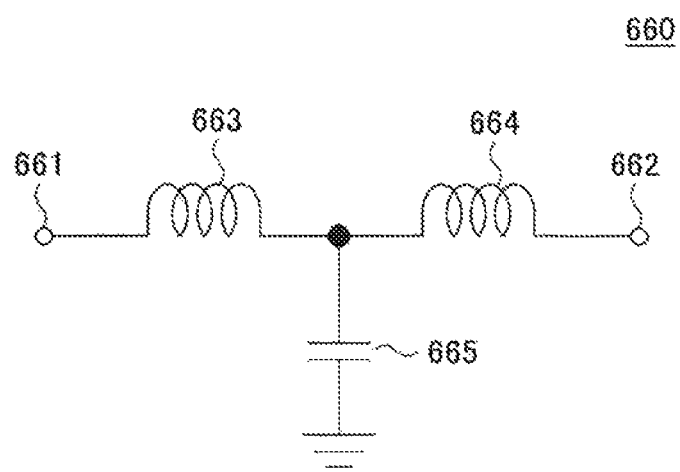
FIG. 13A-13B are diagrams illustrating a double harmonic wave pass filter 660 of the amplifier 600 according to the second embodiment.
Figure 13B:
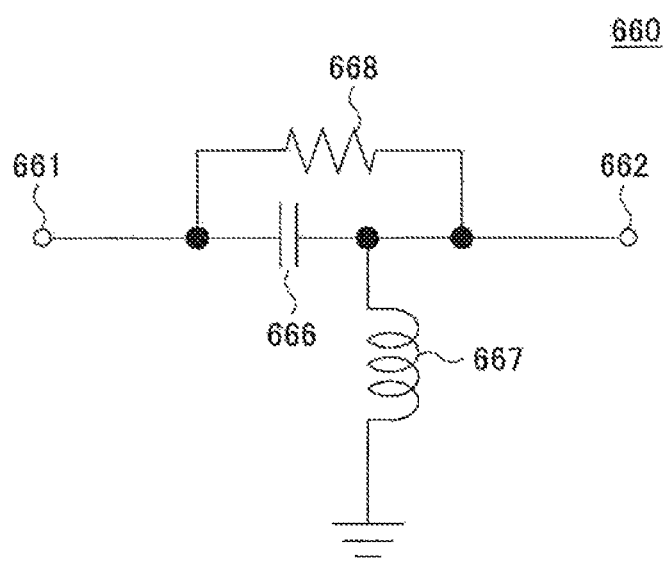

FIGS. 13A-13B are diagrams illustrating the double harmonic wave pass filter 660 of the amplifier 600 according to the second embodiment.

The double harmonic, wave pass filter 660 includes, for example, terminals 661 and 662, inductors 663 and 664, and a capacitor 665 as illustrated in FIG. 13A.

The terminal 661 is connected with the input matching circuit 110 and the gates of the transistor 120. The terminal 662 is connected with the inductor 631. The inductors 663 and 664 are connected in series between the terminals 661 and 662. The capacitor 665 has one of its terminals connect with a point between the inductors 663 and 664, and the other end grounded.

To make the double harmonic wave of a transmission signal pass through the double harmonic wave pass filter 660 illustrated in FIG. 13A, a combination of values of the inductance of the inductors 663 and 664 and the capacitance of the capacitor 665 may be appropriately selected. The adjustment voltage δVg can pass through the terminals 661 and 662 because the double harmonic wave pass filter 660 illustrated in FIG. 13A has two inductors 663 and 664 connected in series between the terminals 661 and 662.

Also, as illustrated in FIG. 13B, the double harmonic wave pass filter 660 may have a circuit configuration that includes a capacitor 666 connected between the terminals 661 and 662; an inductor 667 having one of its terminals connected with a point between the capacitor 666 and the terminal 662, and the other terminal grounded; and a resistor 668 connected in parallel with the capacitor 666.

In this case, by adjusting values of the capacitance of the capacitor 666 and the inductance of the inductor 667, it may be configured so that only a DC component passes through the resistor 668.

The double harmonic wave pass filter 660 illustrated in FIG. 13B can make the double harmonic wave of the transmission wave pass through between the terminals 661 and 662, and can make the adjustment voltage δVg pass through.

The gate voltage control unit 630 is provided for controlling a gate voltage applied to the gate of the transistor 120 via the gate voltage control unit 630 from the gate voltage generation unit 140, via the double harmonic wave pass filter 660.

The gate voltage control unit 630 includes the inductor 631, a diode 132, and a capacitor 133. The inductor 631 is a coil not having a center tap 131A, which differs from the inductor 131 in the first embodiment. One of the terminals of the inductor 631 (a terminal on the left side in the figure) is connected with the double harmonic wave pass filter 660. Also, the other terminal of the inductor 631 (a terminal on the right side in the figure) is connected with the anode of the diode 132.

The inductance L of the inductor 631 is set to a value with which an LC resonance circuit is configured along with the capacitor 133. The resonance frequency of the LC resonance circuit is set to the frequency (2f) of the double harmonic wave. The frequency (2f) of the double harmonic wave is twice the frequency (f) of the fundamental wave.

This is to make the signal of the double harmonic wave output from the inductor 631 applied entirely to both terminals of the diode 132, by selecting values of the inductor L of the inductor 131 and the capacitance C of the capacitor 133 so that the impedance is zero (shorted) with respect to the double harmonic wave. Note that such values of the inductance L of the inductor 131 and the capacitance C of the capacitor 133 satisfy $2f=\frac{1}{2}p\sqrt{LC}$.

Only the double harmonic wave of the transmission signal is input into the inductor 631 via the double harmonic wave pass filter 660.

The diode 132 has its anode connected with one of the terminals of the inductor 631 (a terminal on the right side in the figure), and its cathode connected with one of the terminals of the capacitor 133 and the output terminal 140A of the gate voltage generation unit 140.

The diode 132 is provided for controlling the gate voltage of the transistor 120 depending on the strength of the double harmonic wave (amplitude) output from the inductor 631. The diode 132 configures a clipping circuit along with the gate voltage generation unit 140.

The capacitor 133 has one of its terminals connected with the cathode of the diode 132 and the output terminal 140A of the gate voltage generation unit 140, and the other terminal grounded.

Note that the adjustment voltage δVg output by the gate voltage control unit 630 to the gate of the transistor 120 is generated when the output side voltage of the diode 132 is changed by the clipping circuit as the strength of the transmission signal (amplitude) input into the input terminal 101 increases.

In the amplifier 600 in the second embodiment, when the strength of the transmission signal (amplitude) input into the input terminal 101 increases, the adjustment voltage δVg is reduced that is output by the gate voltage control unit 630 to the gate of the transistor 120. This is the same as in the amplifier 100 in the first embodiment.

In the amplifier 600 configured as above, when the strength of the transmission signal (amplitude) input into the input terminal 101 increases from the initial value, the input side of the diode 132 is reduced, and the adjustment voltage δVg is reduced to take a negative value.

This makes the gate voltage Vg input into the gate of the transistor 120 reduced less than the initial value Vg0.

Note that when the strength of the transmission signal (amplitude) increases from the initial value, the gate voltage Vg is reduced by the adjustment voltage δVg. Therefore, if setting is made to take a value less than or equal to the allowed upper limit of the strength of the IM3 signal IM3UL, it is possible to drive the amplifier 600 under an operational condition where the strength of the IM3 signal is low when driving the amplifier 600.

Therefore, if the diode 132 is made to have a forward directional characteristic to output δVg for realizing the characteristics Vg1 to Vg8 illustrated in FIG. 9, the amplifier 600 of the second embodiment can obtain a characteristic where the IM3 signal is reduced as illustrated FIG. 9.

Thus, according to the second embodiment, it is possible to provide an amplifier 600 having a simple configuration, and operational in a region where distortion is small.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present, invention have been described in detail, it should be understood that various changes, substitutions, and alterations could be made hereto without departing from the spirit and scope of the invention.

What is claimed is:

1. An amplifier comprising:
    a pair of power input terminals configured to receive differential transmission signals, the differential transmission signals being two-tone signals;
    a pair of power output terminals;
    a coil configured to have a first terminal and a second terminal, the first terminal and the second terminal being connected with the pair of power input terminals, respectively, and to have a center tap;
    a first transistor configured to have a first gate connected with the first terminal of the coil, and a first output terminal connected with one of the pair of power output terminals;
    a second transistor configured to have a second gate connected with the second terminal of the coil, and a second output terminal connected with another of the pair of power output terminals;
    a diode configured to have a third terminal and a fourth terminal, the third terminal being connected with the center tap of the coil;
    a gate voltage generation unit configured to have a seventh terminal connected with the fourth terminal of the diode, the seventh terminal outputting a predetermined gate voltage to turn on the first transistor and the second transistor; and
    a capacitor configured to have a fifth terminal and a sixth terminal, the fifth terminal being connected with a point between the fourth terminal of the diode and the seventh terminal of the gate voltage generation unit, the sixth terminal being connected with a reference potential point,
    wherein an inductance of the coil and a capacitance of the capacitor are set to respective values so that a resonance frequency obtained in an LC resonance circuit including the coil and the capacitor becomes a frequency of a double harmonic wave of the transmission signals input into the pair of power input terminals, and
    wherein the diode is configured to adjust a voltage at the third terminal depending on a signal level of the double harmonic wave of the transmission signals supplied to the third terminal from the center tap of the coil.

2. The amplifier as claimed in claim 1, wherein the diode and the capacitor configure a clipping circuit,
    wherein the clipping circuit adjusts the voltage at the third terminal of the diode by clipping the double harmonic wave supplied to the third terminal of the diode from the center tap of the coil so that a signal level of a distortion component included in outputs of the first transistor and the second transistor is less than or equal to a predetermined value for a change of a signal level of the transmission signals.

3. The amplifier as claimed in claim 2, wherein each of the first transistor and the second transistor has characteristics in which a minimal value of the distortion component is shifted toward a high-output side as the gate voltage is reduced;
wherein the third terminal of the diode is an anode, and the fourth terminal of the diode is a cathode.

4. The amplifier as claimed in claim 2, wherein each of the first transistor and the second transistor has characteristics in which a minimal value of the distortion component is shifted toward a high-output side as the gate voltage is increased;
wherein the fourth terminal of the diode is a cathode, and the third terminal of the diode is an anode.

5. An amplifier comprising:
a power input terminal configured to receive a single-ended transmission signal, the single-ended transmission signal being a two-tone signal;
an power output terminal;
a filter configured to have an input terminal and an output terminal, the input terminal being connected with the power input terminal, the filter transmitting a double harmonic wave of the transmission signal;
a coil configured to have a first terminal and a second terminal, the first terminal being connected with the output terminal of the filter;
a transistor configured to have a gate connected with the input terminal of the filter, and an output terminal being connected with the power output terminal;
a diode configured to have a third terminal and a fourth terminal, the third terminal of the diode being connected with the second terminal of the coil; and
a gate voltage generation unit configured to have a fifth terminal being connected with the fourth terminal of the diode, the fifth terminal outputting a predetermined gate voltage to turn on the transistor; and
a capacitor configured to have a sixth terminal and a seventh terminal, the sixth terminal connected with a point between the fourth terminal of the diode and the fifth terminal of the gate voltage generation unit, and the seventh terminal being connected with a reference potential point,
wherein an inductance of the coil and a capacitance of the capacitor are set to respective values so that a resonance frequency obtained in an LC resonance circuit including the coil and the capacitor becomes a frequency of the double harmonic wave of the transmission signal input into the power input terminal, and
wherein the diode is configured to adjust a voltage at the third terminal depending on a signal level of the double harmonic wave of the transmission signal supplied to the third terminal of the diode via the coil.

* * * * *